United States Patent
Paul (10) Patent No.: US 9,702,952 B2
(45) Date of Patent: Jul. 11, 2017

(54) METHOD AND DEVICE FOR DETERMINATION OF A MAGNETIC RESONANCE CONTROL SEQUENCE

(71) Applicant: Siemens Aktiengesellschaft, Munich (DE)

(72) Inventor: Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 602 days.

(21) Appl. No.: 14/260,609

(22) Filed: Apr. 24, 2014

(65) Prior Publication Data

US 2014/0320127 A1    Oct. 30, 2014

(30) Foreign Application Priority Data

Apr. 24, 2013 (DE) .................. 10 2013 207 390

(51) Int. Cl.
*G01R 33/54* (2006.01)
*G01R 33/483* (2006.01)
*G01R 33/565* (2006.01)
*G01R 33/561* (2006.01)

(52) U.S. Cl.
CPC ....... *G01R 33/543* (2013.01); *G01R 33/4833* (2013.01); *G01R 33/56545* (2013.01); *G01R 33/5617* (2013.01)

(58) Field of Classification Search
CPC .............. G01R 33/543; G01R 33/4833; G01R 33/56545; G01R 33/5617
See application file for complete search history.

(56) References Cited

U.S. PATENT DOCUMENTS

| | | |
|---|---|---|
| 5,270,654 A | 12/1993 | Feinberg et al. |
| 2003/0173965 A1 | 9/2003 | Oesingmann |
| 2004/0068175 A1 | 4/2004 | Miyazaki et al. |
| 2005/0264286 A1 | 12/2005 | Harder |
| 2010/0025335 A1 | 2/2010 | Shimaki |
| 2010/0201360 A1 | 8/2010 | Morita |
| 2012/0025824 A1 | 2/2012 | Harder et al. |
| 2013/0033263 A1 | 2/2013 | Fautz et al. |
| 2013/0082707 A1 | 4/2013 | Biber et al. |
| 2013/0169273 A1 | 7/2013 | Grodzki |
| 2015/0008925 A1* | 1/2015 | Shirai ................ G01R 33/4804 324/318 |

OTHER PUBLICATIONS

"Inner Volume MR Imaging: Technical Concepts and Their Application," Feinberg et al., Radiology, vol. 156 (1985) pp. 743-747.

* cited by examiner

*Primary Examiner* — Rodney Bonnette
(74) *Attorney, Agent, or Firm* — Schiff Hardin LLP

(57) ABSTRACT

In a method and device for the determination of a magnetic resonance control sequence that includes at least one first pulse arrangement that acts in a spatially selective manner in a first selection direction and a subsequent second pulse arrangement that acts in a spatially selective manner in a second selection direction, viewing volume dimension parameter values are registered that define the spatial extent of a viewing volume to be excited. The first selection direction and the second selection direction are established automatically depending on a length ratio of the spatial extent of the viewing volume to be excited in the different selection directions.

10 Claims, 6 Drawing Sheets

METHOD AND DEVICE FOR DETERMINATION OF A MAGNETIC RESONANCE CONTROL SEQUENCE

BACKGROUND OF THE INVENTION

Field of the Invention

The present invention concerns a method to determine a magnetic resonance control sequence which has at least one first pulse arrangement that acts in a spatially selective manner in a first selection direction, and a subsequent second pulse arrangement that acts in a spatially selective manner in a second selection direction. Moreover, the invention concerns a method to operate a magnetic resonance system with such a magnetic resonance control sequence, a control sequence determination device in order to determine such a magnetic resonance control sequence, and a magnetic resonance system with such a control sequence determination device.

Description of the Prior Art

In a magnetic resonance system (also called a magnetic resonance tomography system), the body to be examined is typically exposed to a relatively high basic magnetic field ($B_0$ field), for example of 1, 5, 3 or 7 Tesla, with the use of a basic field magnet. A magnetic field gradient is additionally applied by a gradient system. Via a radio-frequency transmission system, radio-frequency excitation signals (RF signals) are then emitted (radiated) by suitable antennas, which cause nuclear spins of specific atoms to be excited to resonance by the associated radio-frequency field ($B_1$ field). This excitation can be described as the nuclear spins being flipped (deflected) by a defined flip angle relative to the magnetic field lines of the basic magnetic field. Upon relaxation of the nuclear spins, radio-frequency signals, known as magnetic resonance signals, are radiated that are then received (detected) by suitable reception antennas and are then processed further. The desired image data can be reconstructed from the raw data acquired in such a manner.

For a defined measurement (data acquisition), a pulse sequence with a radio-frequency pulse train is emitted and a gradient pulse train (with matching gradient pulses in the slice selection direction, in the phase encoding direction and in the readout direction) is switched (activated) in coordination with the radio-frequency pulse train. For imaging, the timing within the sequence, i.e. the time intervals that pulses follow one another, is particularly significant. A number of control parameter values is normally defined in a sequence known as a measurement protocol, which is created in advance and retrieved (for example from a memory) for a defined measurement, and which can be modified as necessary on site by the operator, who can provide additional control parameter values (for example a defined slice interval of a stack of slices to be measured, a slice thickness, etc.). A magnetic resonance control sequence is then calculated on the basis of all of these control parameter values. This magnetic resonance control sequence is also designed as a measurement sequence, "MR sequence" (magnetic resonance sequence), or shortened to just "sequence".

In the classical procedures, the acquisition of images of the interior of the object takes place slice by slice. Nuclear spins in a relatively thin slice are excited, which is referred to as the slice being individually excited, typically a slice between 1 and 5 mm in thickness. Such a selective excitation is achieved by activating a gradient in the slice selection direction in coordination with the radiation of a radio-frequency excitation pulse. Such a pulse arrangement (including the exciting radio-frequency pulse and the associated gradient) causes the radio-frequency pulse to act only selectively on the region defined by the gradient. In most cases, this slice selection direction proceeds parallel to the axis that is commonly defined as the z-axis (the longitudinal axis of the scanner, which is also the longitudinal axis of a patient lying in the scanner. Spatial coding within a slice then takes place by phase encoding in one direction (most often the y-direction) and by a readout coding in another direction (most often the x-direction). In this way, a two-dimensional frequency domain (known as k-space) is filled by entering the raw data at designated points in a memory. An image of the slice is created from the k-space data by a two-dimensional Fourier transformation.

It is also possible to excite nuclear spins in, and acquire MR signals from, larger three-dimensional volumes, in a 3D method. In such methods rather than a thin slice, a relatively thick slice (typically designated as a "slab") is excited in an excitation process. The raw data from these slabs (most of which are more than 10 mm thick) are acquired again with spatial resolution in the slice selection direction. This typically takes place via a second phase encoding, meaning that data acquisition takes place in such methods with phase encoding in two directions and readout encoding in one direction, in order to thus fill three-dimensional k-space with raw data, and to generate a three-dimensional image volume therefrom via a 3D Fourier transformation.

Since the phase encoding steps during the data acquisition essentially define the total acquisition time for the raw data, it is advantageous to operate with optimally few phase encoding steps. It is nevertheless necessary, k-space must be covered (filled) sufficiently densely enough (meaning that a sufficient sampling must take place), since otherwise aliasing could occur. In order to sample sufficiently densely, the length of the volume to be excited should be optimally short in each of the phase encoding directions, such that the volume in the spatial domain completely encompasses the region of interest. In the slice selection direction, the volume is established by the boundaries of the slab, which means that the slab thickness and thus the length of the volume that is to be covered by the phase encoding in a slice selection direction can be determined by the selection of the first pulse arrangement. However, normally the entire subject width must be considered in the second phase encoding direction orthogonal to the slice selection direction. In order to also limit the width in this direction, it has been proposed to emit, with the radio-frequency excitation pulse, an additional pulse arrangement that acts selectively in a second direction (namely a refocusing pulse with corresponding gradients switched in the second direction) after the first pulse arrangement that selectively acts in the slice selection direction. For example, this method, also designated as "inner volume refocusing", is described by D. A. Feinberg, J. C. Hoenninger, L. E. Crooks, L. Kaufman, J. C. Watts, and M. Arakawa in "Inner volume MR imaging: technical concepts and their application," Radiology 156, 743-747, 1985.

A viewing volume in two directions is thereby selectively bounded, and improvements with regard to the artifacts such as aliasing can already be achieved in both directions in spite of the reduction of the phase encoding steps. However, it has turned out that aliasing artifacts or even signal cancelations can still occur, such as from fat tissue due to the chemical shift, particularly if a larger field of view is selected.

SUMMARY OF THE INVENTION

An object of the present invention is to provide a method to determine a magnetic resonance control sequence of the aforementioned type, and a corresponding control sequence determination device, with which the risk of creating aliasing in the images can be even further reduced.

As mentioned above, in the method according to the invention a magnetic resonance control sequence is determined that includes at least one first pulse arrangement (for example the slab excitation radio-frequency pulse with the associated gradient) that acts in a spatially selective manner in a first selection direction, for example the slice selection direction. Even if a phase encoding in the slice selection direction takes place in a 3D acquisition method, for differentiation in the following this direction will furthermore be designated as a slice selection direction, and the classical phase encoding direction will be designated as a phase encoding direction. This first pulse arrangement directly or indirectly (i.e. after possible additional pulses) follows a second pulse arrangement that, for example, includes a refocusing radio-frequency pulse and the associated gradient that acts selectively in a second direction (for example the classical phase encoding direction). For example, in this way the cited inner volume refocusing can be achieved, and overall a viewing volume with limited dimensions in the slice selection direction and in the phase encoding direction can be excited. The first and second selection directions are preferably situated orthogonally to one another.

Viewing volume dimension parameter values are detected that define the spatial extent of the viewing volume to be excited in the various directions. For example, these can simply be the width in the slice selection direction and the width in the classical phase encoding direction, as well as possibly also the width within the readout coding direction, which advantageously is again orthogonal to the other two directions. The geometric dimensions of the field of view can also be defined at least in part by a reference to other measurements, for example by specifying one dimension in a ratio as a proportion or multiple of another dimension or the like. For example, the extent of the field of view in the x-direction can be indicated directly (in mm), the dimension in the y-direction can be indicated in % of the extent of the field of view in the x-direction (for example 50%), and the dimension in the z-direction can be indicated as a number of slices in the field of view or in the slab (for example 64), from which the thickness of the field of view in the z-direction results by multiplication with the layer thickness (1 mm, for example) of the slice images to be reconstructed in the field of view (=64 mm with the given example data).

The acquisition of the viewing volume dimension parameter values can also be an adoption of the data from other components of the magnetic resonance system, for example via a user interface or from a memory unit with a database, etc. The user interface can be a graphical user interface for manual entry of such data.

According to the invention, the first selection direction and the second selection direction are then automatically established depending on the length ratio of the spatial extent of the slice volume to be excited in the different selection directions, i.e. depending on at least two of the viewing volume dimension parameter values of the viewing volume to be excited in the different directions, for example. This deviates from the conventional procedures, according to which the first selection direction and the second selection direction are typically hard set in advance, for example are permanently defined within a control protocol. Conventional procedures establish the slice selection direction in the z-direction and the phase encoding direction in the y-direction orthogonal to the z-direction (i.e. the direction of the body of the patient). In contrast to this, in the method according to the invention the possible selection directions can merely be established in advance. For example, the directions (x-, y- and z-directions, for example) to serve as selection directions can be established in advance, but not the directions in which the slice selection and the selective refocusing take place, for example.

The invention is based on the insight, subsequently verified, that the strict specification of the first selection direction and the second selection direction, in particular the slice selection direction and the phase encoding direction, independently of how the viewing volume expands in the individual directions, often leads to suboptimal results with regard to the aliasing artifacts. This is explained in detail below. However, an optimal solution to the acute requirements can always be found by the subsequent establishment of the first and second selection directions depending on the length ratio of the dimensions of the viewing volume to be excited, and thus in many of cases artifacts due to aliasing can be entirely avoided.

A control sequence determination device according to the invention for the determination of such a magnetic resonance control sequence with at least one first pulse arrangement that acts in a spatially selective manner in a first selection direction, and a subsequent second pulse arrangement that acts in a spatially selective manner in a second selection direction, requires at least one input interface arrangement to receive viewing volume dimension parameter values that define the spatial extent of a viewing volume to be excited. Moreover, according to the invention the control sequence determination device requires a direction definition unit which is designed in order to establish the first and second selection direction automatically depending on a length ratio of the spatial extent of the viewing volume to be excited in the different (potential) selection directions of the viewing volume to be excited. Finally, the control sequence determination device must additionally have a pulse arrangement determination unit to determine the pulse arrangements or, respectively, the complete sequence under consideration of the viewing volume dimension parameter values and the established first selection direction and second selection direction.

Moreover, the control sequence determination device should have a suitable control sequence output interface in order to pass the sequence to other control units of the magnetic resonance tomography system. For example, the control sequence output interface can be an interface that transmits the sequence to a magnetic resonance controller in order to therefore directly control the measurement, but also an interface that sends the data via a network and/or stores said data in a memory for later use.

In addition to a radio-frequency transmission device to emit the radio-frequency pulses, a magnetic resonance system according to the invention has a gradient system to switch the necessary gradients and a control device that is designed in order to emit a radio-frequency pulse train for implementation of a desired measurement on the basis of a predetermined magnetic resonance control sequence, and to emit a gradient pulse train in coordination with this via the gradient system. Moreover, the magnetic resonance system has a control sequence determination device described above in order to determine a control sequence in the manner according to the invention and to pass this to the control device.

In a method according to the invention for the operation of a magnetic resonance system, a control sequence is determined according to the previously described method, and then the magnetic resonance system is operated using the control sequence.

Significant portions of the control sequence determination device can be designed in the form of software components. This in particular concerns the direction definition unit and the pulse arrangement determination unit. The aforementioned interfaces can likewise be designed at least in part in the form of software, and can possibly access hardware interfaces of an existing computer. The invention thus also includes a non-transitory, computer-readable data storage medium encoded with programming instructions that can be loaded directly into a memory of a control sequence determination device. The programming instructions cause the device to implement all steps of the method according to the invention when the programming instructions are executed in the control sequence determination device. Such a realization in software has the advantage that previous devices, that are used to determine control sequences, can also be modified suitably via implementation of the program in order to determine control sequences optimized in the manner according to the invention.

As noted above, the method according to the invention is particularly advantageous when the first pulse arrangement includes a slab excitation radio-frequency pulse and the second pulse arrangement includes a refocusing radio-frequency pulse as this is required in a sequence for inner volume refocusing, for example. A mean target flip angle of the slab excitation radio-frequency pulse is thereby advantageously smaller than a mean target flip angle of the refocusing radio-frequency pulse.

Although the method according to the invention can be applied particularly advantageously in a sequence for inner volume refocusing, this does not preclude the use of the method according to the invention in other pulse sequences in which particular optimization effects can be achieved by the different selection directions being established depending on the dimensions of the desired viewing volume.

In a preferred embodiment of the method, a first selection direction parameter (for example a slice selection direction parameter, i.e. a control command which specifies which of the possible spatial directions is the slice selection direction) and a second selection direction parameter (for example a refocusing direction parameter) are initially registered, which second selection direction parameter defines the second selection direction, i.e. which indicates in which of the additional selection directions the refocusing pulse is then selectively emitted, or the gradient is switched for the refocusing radio-frequency pulse. This registration of the first and second selection direction parameters can take place via a user interface in which a user explicitly specifies these directions. However, these selection direction parameters are typically read out from a protocol that is already provided for the respective control sequence type and will only be selected by the operator and modified via adjustment of specific additional parameters. The first and second selection direction parameters are then automatically changed when the first selection direction and the second selection direction do not correspond to the condition predetermined depending on the viewing volume dimension parameter values. In other words, a condition is previously established that defines with what dependency on the dimensions of the viewing volume to be excited the first and the second selection directions are to be selected, and a review of the registered selection direction parameters then takes place with regard to this condition. If the condition is not satisfied, a corresponding change (for example, an exchange) of the selection direction parameters takes place so that the condition is complied with.

For this purpose, the control sequence determination device has a selection direction parameter interface in order to register the first selection direction parameter (which defines the first selection direction) and the second selection direction parameter (which defines the second selection direction). For example, this can also be the aforementioned user interface, or an interface in order to read out the data from a predetermined protocol. The control sequence determination device moreover has a direction parameter test unit that checks whether the first selection direction and the second selection direction correspond to a condition predetermined depending on the viewing volume dimension parameter values, as well as a direction parameter modification unit which automatically modifies the first and second selection direction parameters if the first and second selection directions do not correspond to the predetermined condition.

This procedure has the advantage that no changes are required in protocols that have already been used. All user inputs can also take place in the same manner as before, and the entire method proceeds entirely automatically in the background without the operator needing to be aware of any change. In particular, the following advantage is achieved: 2D images are normally displayed in the dimensions of "readout direction" and "phase encoding direction". Given a 3D measurement, the slice selection direction is also the dimension across the image stack. Given a change of the axes or selection directions in the manner according to the invention, however, the observation viewing angle for the user remains the same, meaning that a sagittal acquisition remains a sagittal acquisition and does not change, for example. The method then merely shows that the image data have correspondingly few artifacts due to the optimized direction selection.

It has turned out that, in the case of an inner volume refocusing method, it is particularly advantageous for the second selection direction—i.e. the direction in which the refocusing pulse acts selectively—to be set in the direction of the least extent of the viewing volume. In other words: the direction selection takes place so that the refocusing radio-frequency pulse and the associated gradient select the volume in the direction of the smallest width of the desired viewing volume.

Insofar as a slice selection direction parameter and a refocusing direction parameter are registered (for example from a protocol) and are then checked with regard to the selected condition, as described above, this means that the first selection direction and the second selection direction are swapped when the registered slice selection direction parameter and the registered refocusing direction parameter define the first and second selection direction such that the second selection direction lies in the direction of a longer extent of the viewing volume than the first selection direction.

This condition or selection of the selection directions is therefore advantageous because, given the inner volume refocusing method, the refocusing pulse must typically achieve a significantly higher target flip angle than the slab excitation radio-frequency pulse. Namely, for the slab excitation radio-frequency pulse a mean target flip angle of 90° is typically predetermined, in contrast to which the subsequent refocusing pulse optimally has a mean target flip angle of 180°; but it may also be somewhat reduced under the circumstances, for example to a value between 145° and 180°. In the extreme case, the refocusing radio-frequency pulse thus has nearly twice as large a target flip angle as the slab excitation radio-frequency pulse. In order to achieve such a large target flip angle, the refocusing radio-frequency pulse must have a correspondingly high amplitude. The radio-frequency amplitude, however, is limited by the technical system and/or by SAR conditions (SAR=specific absorption rate, the maximum permissible radio-frequency exposure of a patient). Nevertheless, in order to achieve the desired target flip angle given a limited amplitude, the refocusing radio-frequency pulse must consequently be temporally extended, i.e. will be made relatively long. Since the bandwidth of the pulse is in turn reciprocally proportional to the pulse duration, this long pulse duration leads to a reduced bandwidth of the refocusing radio-frequency pulse. However, the bandwidth in turn determines the required gradient strength for a defined thickness of a slice to be excited or to be refocused. The smaller the bandwidth, the lower that the amplitude of the gradient used for the spatial selection must also be in order to excite or, respectively, refocus the same spatial width. However, the smaller the slice selection gradient, the greater the susceptibility to inhomogeneities of the basic field magnet and the chemical shift. In combination, these conditions ultimately lead to the situation that with an inner volume refocusing method, unwanted aliasing of fat signals and/or cancellation artifacts of water signals occur in the image data specifically in the refocusing direction, in which a significantly higher sensitivity to $B_0$ inhomogeneities and chemical shift effects exists due to the low gradient amplitude. With the use of the method according to the invention, it can be assured that the refocusing pulse acts slice-selectively in the direction that has the smallest extent of the viewing volume to be excited that is established by the operator. The gradient amplitude thus can be chosen to be somewhat greater than given a refocusing in the direction of a larger volume width, such that the sensitivity to $B_0$ inhomogeneities and the chemical shift are reduced. As a result, the risk of artifacts due to aliasing of adipose tissue is reduced.

This procedure is reasonable because, given an inner volume refocusing method, the operator typically also selects the field of view to be shorter in the z-direction than in the phase encoding direction situated orthogonal to this. This is due to the fact that the operator is accustomed to this procedure from the typical slice excitation methods with thin slices. Moreover, in the typical protocols the slice selection direction is set in the z-direction and the refocusing direction is set in the classical phase encoding direction (most often the y-direction). In most cases, this leads to the situation that, computationally, that direction in which the refocusing radio-frequency pulse should act selectively is one of the directions with the longer dimensions. With the described procedure, it is now possible to achieve an optimal position with improved image data results, simply by interposing the described method step with a check of the spatial direction conditions, and possibly the automatic change of the directions if these conditions are not complied with, without a modification of the existing protocols and without influencing the selection of the field of view dimensions by the operator.

DESCRIPTION OF THE PREFERRED EMBODIMENTS

Figure 1:
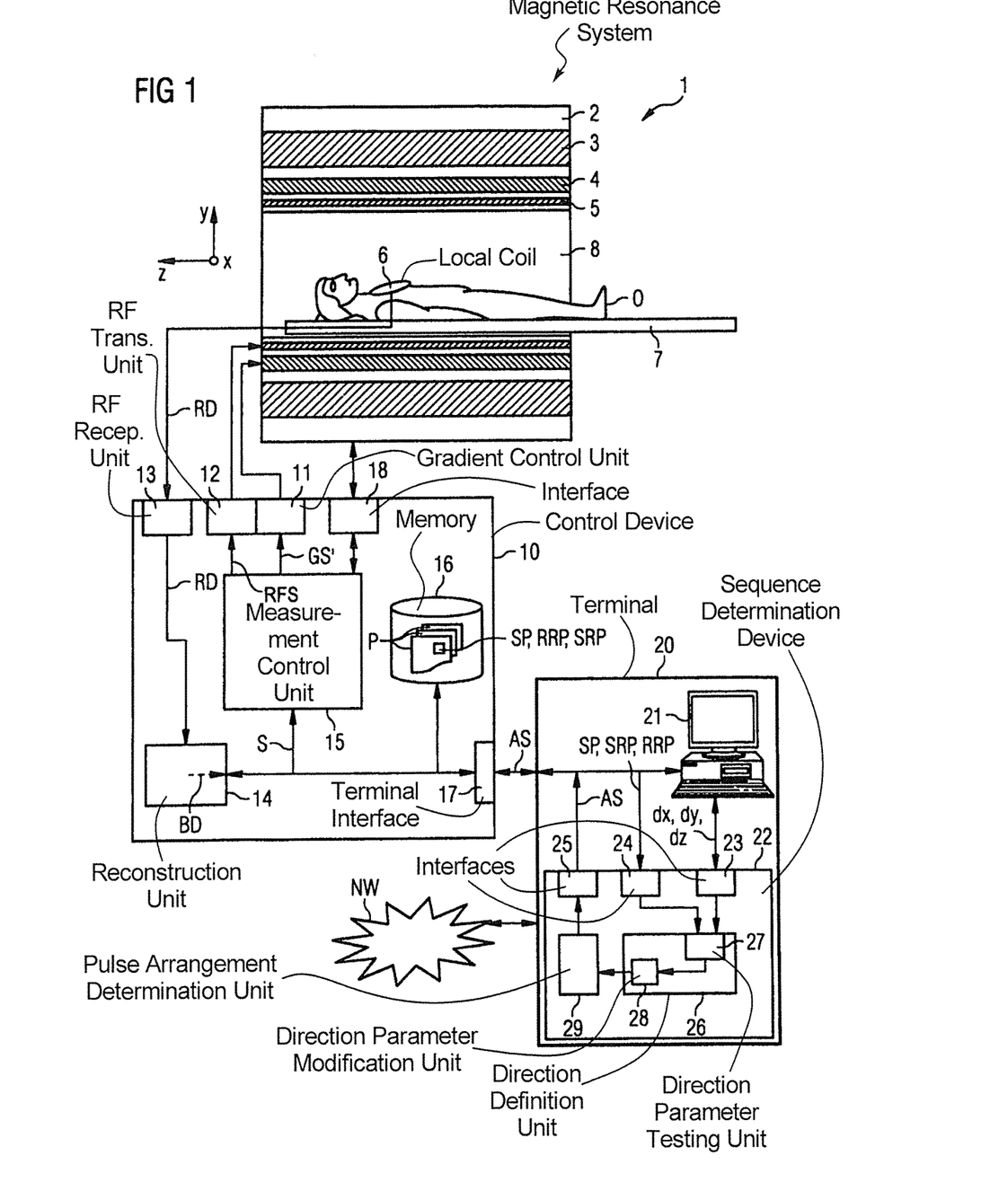
FIG. 1 is a schematic depiction of an exemplary embodiment of a magnetic resonance system according to the invention.

A magnetic resonance system 1 according to the invention is schematically depicted in FIG. 1. The system includes the actual magnetic resonance scanner 2 with an examination space 8 or patient tunnel 8 therein. A bed 7 can be driven into this patient tunnel 8, such that a patient O or test subject lying on said bed 7 can be supported at a defined position within the magnetic resonance scanner 2 (relative to the magnet system and radio-frequency system arranged therein) during an examination, or so that the patient O or test subject on said bed 7 can also be moved between different positions during a measurement (data acquisition).

Among the components of the magnetic resonance scanner 2 are a basic field magnet 3, a gradient system 4 with magnetic field gradient coils to generate magnetic field gradients in the x-, y- and z-directions, and a whole-body radio-frequency coil 5. The magnetic field gradient coils in the x-, y- and z-direction are controllable independently of one another so that—via a predetermined combination—gradients can be applied in arbitrary logical spatial directions (for example in a slice selection direction, in a phase encoding direction or in a readout direction) that are not situated in parallel to the axes of the spatial coordinate system. The acquisition of magnetic resonance signals induced in the examination subject O can take place via the whole-body coil 5 with which the radio-frequency signals for induction of the magnetic resonance signals are also normally emitted. However, these signals are typically received with a local coil arrangement 6 with local coils (of which only one is shown here) placed on or below the patient O, for example. All of these components are known in principle to those skilled in the art, and therefore are only roughly schematically depicted in FIG. 1.

The components of the magnetic resonance scanner 2 are controllable from a control device 10. This can be a control computer which can also comprise a plurality of individual computers (which possibly are also spatially separated and connected among one another via suitable cables or the like). This control device 10 is connected via a terminal interface 17 with a terminal 20 via which an operator can control the entire system 1. In the present case, this terminal 20 has a computer 21 with keyboard, one or more monitors, and additional input devices (for example mouse or the like), or is designed as such a computer 21, such that a graphical user interface is provided to the operator.

Among other things, the control device 10 has a gradient control unit 11 that can in turn comprise multiple subcomponents. The individual gradient coils can be fed with control signals according to a gradient pulse sequence GS via this gradient control unit 11. As described above, these are hereby gradient pulses that are set at precisely provided temporal positions and with a precisely predetermined time curve during a measurement.

Moreover, the control device 10 has a radio-frequency transmission unit 12 in order to feed respective radio-frequency pulses into the whole-body radio-frequency coil 5 according to a predetermined radio-frequency pulse sequence RFS of the control sequence AS. The radio-frequency pulse sequence RFS includes the aforementioned excitation and refocusing pulses. The receipt of the magnetic resonance signals then occurs with the aid of the local coil arrangement 6, and the raw data RD acquired by this are read out and processed by an RF reception unit 13. The magnetic resonance signals in digital form are passed as raw data RD to a reconstruction unit 14, which reconstructs the image data BD from these and stores them in a memory 16 and/or passes them via the interface 17 to the terminal 20 so that the operator can view them. The image data BD can also be stored and/or displayed and evaluated at other locations via a network NW. Alternatively, a radio-frequency pulse sequence can also be emitted via the local coil arrangement and/or the magnetic resonance signals can be received by the whole-body radio-frequency coil (not shown).

Via an additional interface 18, control commands are transmitted to other components of the magnetic resonance scanner 2 (for example the bed 7 or the basic field magnet 3) or measurement values or, respectively, other information are received.

The gradient control unit 11, the RF transmission unit 12 and the RF reception unit 13 are respectively controlled in coordination by a measurement control unit 15. Via corresponding commands, this ensures that the desired gradient pulse sequence GS (i.e. the series of gradient pulses) and radio-frequency pulse sequence RFS of the pulse sequence are emitted. Moreover, it must therefore be ensured that the magnetic resonance signals at the local coils of the local coil arrangement 6 are read out by the RF reception unit 13 at the matching point in time and are processed further, meaning that readout windows must be set in that the ADCs of the RF reception unit 13 are switched to receive, for example. The measurement control unit 15 likewise controls the interface 18.

However, the basic workflow of such a magnetic resonance measurement and the cited components for control are known to those skilled in the art, such that here they do not need to be discussed further in detail. Moreover, such a magnetic resonance scanner 2 and the associated control device can furthermore have a plurality of additional components, which here are likewise not explained in detail. At this point, it is noted that the magnetic resonance scanner 2 can also be designed differently—for example with a laterally open patient space—or as a smaller scanner in which only one body part can be positioned.

In order to start a measurement, via the terminal 20 an operator typically selects a control protocol P provided for this measurement from a memory 16 in which are stored a plurality of control protocols P for different measurements. This control protocol P includes, among other things, various control parameter values SP for the respective measurement. Counting among these control parameter values SP are, for example: the sequence type; the target magnetization for the individual radio-frequency pulses; echo times; repetition times; the various selection directions etc. Slice thicknesses, resolution, number of slices or, respectively—in the case of a 3D excitation, in particular an inner volume method—the slab thickness or additional dimensions of the viewing volume (i.e. the aforementioned viewing volume dimension parameters can likewise already be provided here. All of these parameter values can be offered to the operator for adoption upon retrieval of this protocol, and said operator can also arbitrarily vary the values and adapt them to the current examination job with the aid of the user interface.

Moreover, the user can also retrieve control protocols via a network NW (instead of from the memory 16)—for example from a manufacturer of the magnetic resonance system—with corresponding control parameter values SP, and then use these as described in the following.

Based on the control parameter values SP (including the selected viewing volume dimension parameters), a control sequence AS is then determined according to which the control of the remaining components via the measurement control unit 15 ultimately takes place. The control sequence AS here is calculated in a control sequence determination device 22 that is depicted as part of the terminal 20, and is passed to the control device 10 of the magnetic resonance scanner 2 via a control sequence output interface 25. The detailed functioning of the control sequence determination device 22 and its individual components are explained further in the following.

As explained above, in an inner volume refocusing method a viewing volume $V_{in}$ that is limited in the two selection directions is excited via clever selection of a slab excitation radio-frequency pulse with a gradient switched to match this, as well as a subsequent refocusing radio-frequency pulse, likewise with an associated gradient in a direction situated orthogonal to the first direction. This is presented as an example in FIG. 2. The viewing volume $V_{in}$ (also designated as an "inner volume", or more frequently as a "field of view" or shortened to "FoV") thereby results by the slice region between the volume ES being selectively excited by the slab excitation radio-frequency pulse and the refocusing slice RS being selectively excited by the refocusing radio-frequency pulse. In the third direction, this inner volume $V_{in}$ is limited by the readout coding.

Figure 2:
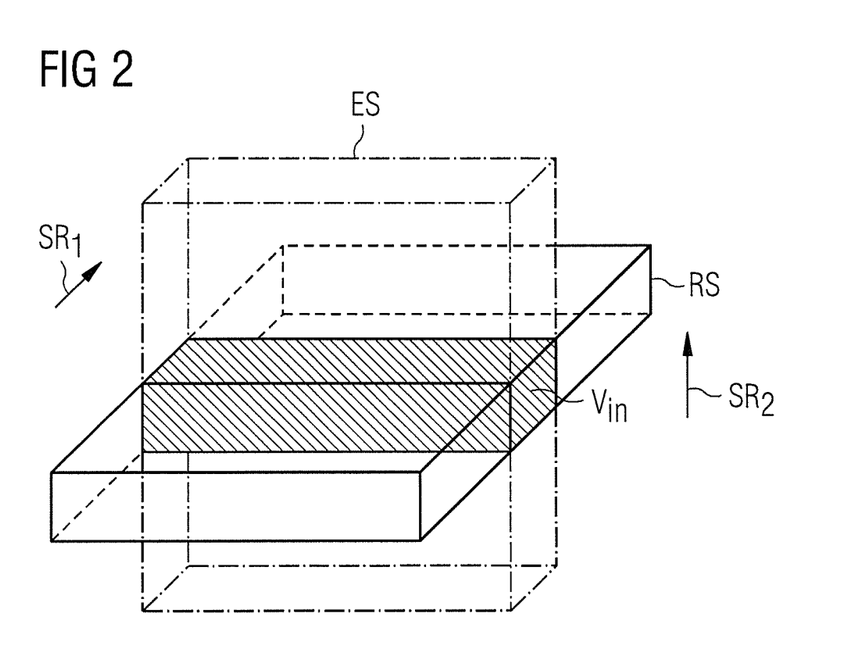
FIG. 2 is a schematic depiction of an example of a field of view that can be selected by means of an inner volume refocusing sequence.

Strictly speaking, the first slice selection direction $SR_1$ and the second slice selection direction $SR_2$ can be placed arbitrarily. However, these directions are typically established by the protocol, wherein most often the first selection direction $SR_1$ in which the slice selection takes place via the slab excitation radio-frequency pulse travels in the z-direction, and the second selection direction $SR_2$ travels orthogonal to this in the y-direction. The corresponding slice selection direction parameter SRP (as a first selection direction parameter) and the refocusing direction parameter RRP (as a second selection direction parameter) which establish these selection directions $SR_1$, $SR_2$ are typically accepted from the control sequence determination device 22 together with the other control parameters SP, for example (as shown in FIG. 1) via an interface 24, which inasmuch also forms a selection direction parameter interface 24. Moreover, via the computer 21 of the terminal 20 with the associated graphical user interface the operator can establish viewing volume dimension parameter values dx, dy, dz, i.e. the length, width and height of the viewing volume $V_{in}$. Corresponding parameters have also possibly already been defined by the control parameter SP in the protocol P, and the operator can modify the viewing volume dimension parameter values dx, dy, dz. Via a suitable interface arrangement 23, the control sequence determination device 22 can accept these viewing volume dimension parameter values dx, dy, dz.

Figure 3:
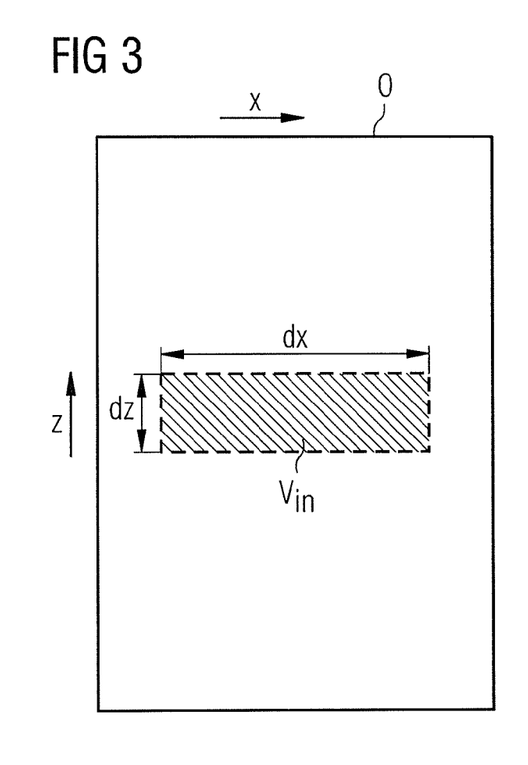
FIG. 3 is a schematic depiction to explain the typical selection of a viewing volume given a 3D excitation in an examination subject in a plan view of said examination subject.
Figure 4:
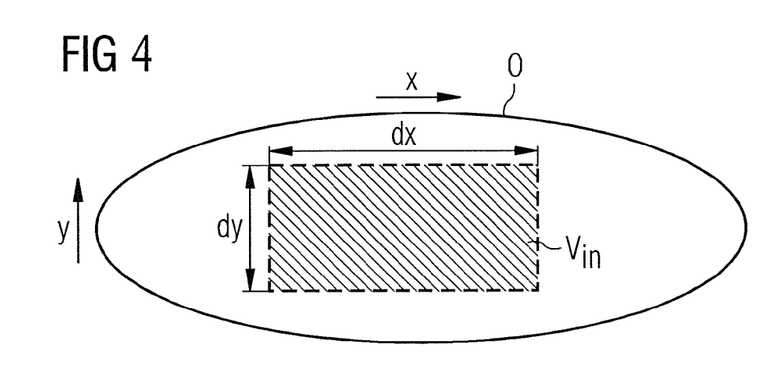
FIG. 4 is a schematic depiction of a viewing volume as in FIG. 3, however now in a section view through the examination subject.

An example of a typical viewing volume $V_{in}$ within a roughly schematically depicted torso of a patient O is depicted in FIGS. 3 and 4. The torso typically extends in the z-direction, i.e. in the direction of the longitudinal axis of the tomograph. FIG. 3 thereby shows a plan view of the upper body from above, and FIG. 4 shows a slice orthogonal to the z-direction. With the aid of the user interface, the operator can enter inputs designating the dimensions of the viewing volume $V_{in}$, i.e. a width in the z-direction dz, a width in the y-direction dy and a width in the x-direction dx. For this purpose, overview images are typically presented to him on the monitor of the computer 21, and with the aid of the graphical user interface he can plot the viewing volume $V_{in}$ so that the matching viewing volume dimension parameter values dx, dy, dz that correspond to the region selected in the overview presentations are generated automatically. As this is also shown in FIGS. 3 and 4, for historical reasons most operators select the viewing volume $V_{in}$ so that it is relatively narrow in the z-direction and is significantly longer in the y-direction and x-direction. This is due to the fact that the operator classically selects individual, thin slices with the conventional multislice applications, wherein he is accustomed to generating slice images orthogonal to the z-axis. However, given a three-dimensional excitation such a selection of the dimensions of the viewing volume $V_{in}$ is not actually necessary at all; rather, the slab could just as well be situated parallel to the z-direction, i.e. have the shortest width in the y-direction.

However, if the viewing volume dimension parameter values dz, dy in the z-direction and y-direction are conventionally selected so that the width in the z-direction is smaller than the width in the y-direction, and at the same time (as this is provided in the previous protocols) the first selection direction $SR_1$ is placed in the z-direction and the second selection direction $SR_2$ is placed in the y-direction, this most often leads to the situation that the gradient amplitude in the second selection direction $SR_2$ must be chosen to be extremely low upon emission of the refocusing radio-frequency pulse in order to achieve a sufficient sampling over the entire width dy of the viewing volume $V_{in}$.

Figure 5:
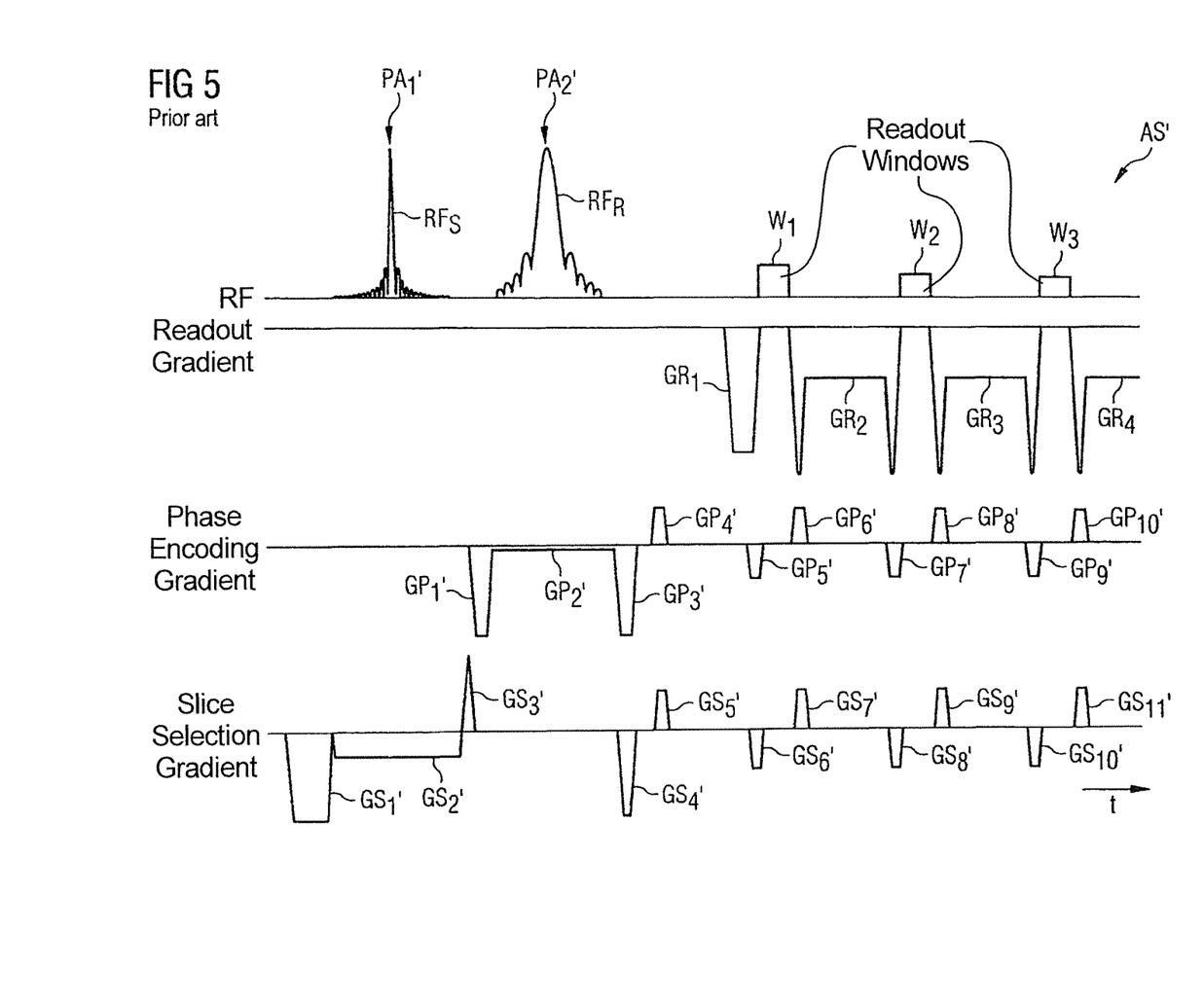
FIG. 5 is a sequence diagram for an example of an inner volume refocusing sequence given a typical selection of the selection directions.

A sequence diagram for a corresponding 3D turbo spin echo sequence (TSE sequence) AS' with an inner volume refocusing is presented in FIG. 5. In this pulse diagram, the radio-frequency pulses and the readout windows, as well as gradients to be switched in coordination with these on various overlapping time axes, are typically shown over time t. FIG. 5 shows only the start of the pulse sequence AS'.

Here the radio-frequency pulses $RF_S$, $RF_R$ and the readout windows $W_1$, $W_2$: $W_3$ are shown on the upper time axis; the gradient pulses $GR_1$, $GR_2$, $GR_3$, $GR_4$ in the readout direction are shown on the time axis lying below this; the gradient pulses $GP_1'$, $GP_2'$, $GP_3'$, $GP_4'$, $GP_5'$, $GP_6'$, $GP_7'$, $GP_8'$, $GP_9'$, $GP_{10}'$ in the classical phase encoding direction are shown on the third time axis; and the gradient pulses $GS_1'$, $GS_2'$, $GS_3'$, $GS_4'$, $GS_5'$, $GS_6'$, $GS_7'$, $GS_8'$, $GS_9'$, $GS_{10}'$, $GS_{11}'$ in the slice selection direction (here z) are shown on the lowermost time axis.

As is apparent in this pulse diagram, a first pulse arrangement $PA_1'$ (consisting of the slab excitation radio-frequency pulse $RF_S$ and the gradient $GS_2'$ switched in parallel with this in the slice selection direction) ensures a selective excitation of a slice in the slice selection direction, i.e. here in the z-direction. The gradient pulse $GS_1$ switched before this gradient pulse $GS_2'$ is a spoiler in order to dephase the residual signal of the previous excitation. The gradient pulses $GS_3'$, $GS_4'$ are rephasers. The signal is dephased by the slice selection gradient $GS_2'$ (as it would be by any gradient) and must be rephased again after the slice selection. It is normally the case that the gradient pulses $GS_3'$, $GS_4'$ together have half the area of the gradient pulse $GS_2'$. Since the gradient pulse $GS_4'$ comes after the refocusing radio-frequency pulse, it has a different polarity than the gradient pulse $GS_3'$.

A second pulse arrangement $PA_2'$ is subsequently emitted with a refocusing radio-frequency pulse $RF_R$ that is accompanied by a parallel gradient pulse $GP_2'$ in the phase encoding direction (i.e. here in the y-direction). This gradient $GP_2'$ in the phase encoding direction ensures that the refocusing radio-frequency pulse also acts selectively. As is shown in FIG. 2, the additional coding can thus be limited to the inner volume $V_n$. The first pulse arrangement $PA_1'$ and the second pulse arrangement $PA_2'$—in particular the gradient pulses $GS_2'$, $GP_2'$—are thereby selected so that the dimensions of the field of view or, respectively, of the inner volume $V_{in}$ correspond precisely to the dimensions in the respective directions as predetermined by the user.

The additional gradient pulses $GR_1$, $GR_2$, $GR_3$, $GR_4$ in the readout direction have the following functions: the gradient pulse $GR_1$ is a dephaser. Via this pulse, the signal is initially dephased in order to then be rephased during the readout window (readout). The signal maximum thereby arises precisely in the middle of the readout. The gradient pulses $GR_2$, $GR_3$, $GR_4$ are normal readout gradients.

The gradient pulses $GP_1'$, $GP_3'$ in the phase encoding direction are spoilers and rephasers arranged around the refocusing pulse $RF_R$ in order to avoid FID artifacts.

The additional gradient pulses in the phase encoding direction $GP_4'$, $GP_{10}'$ are normal phase encoding gradients. The additional gradient pulses in the slice selection direction $GS_5'$, $GS_{11}'$ are likewise normal phase encoding gradients in the slice selection direction.

As is apparent from FIG. 5, the refocusing radio-frequency pulse $RF_R$ is significantly longer than the slab selection radio-frequency pulse $RF_S$. This is due to the fact that, given the refocusing, a significantly greater target flip angle is used (namely from 145° to 180°) than given the slab excitation (in which a target flip angle of 90° is sufficient). However, since the amplitude of the refocusing radio-frequency pulse $RF_R$ cannot be arbitrarily increased for various reasons (for example a system-dependent $B_1$ limit and/or SAR reasons), this pulse must be extended accordingly. For the aforementioned reasons, this extension together with the significantly wider dimension of the inner volume or field of view $V_{in}$ in the y-direction (as is most often predetermined by the operator, as explained using FIG. 4), also leads to the situation that the gradient pulse $GP_2'$ in the phase encoding direction (i.e. in the y-direction) must be chosen to be extremely short. This in turn leads to a high sensitivity to $B_0$ inhomogeneities and effects due to the chemical shift, such that the probability of aliasing artifacts due to adipose tissue is increased.

In order to avoid this problem, in the method according to the invention it is ensured that the first selection direction $SR_1$ and the second selection direction $SR_2$ are selected automatically depending on a length ratio of the dimensions of the viewing volume $V_{in}$ to be excited. For this purpose, it is sufficient to introduce an additional method step into the typical method to create a control sequence AS on the basis of the control parameters SP that are predetermined by the protocol, and on the basis of the viewing volume dimension parameter values dx, dy, dz, as they are confirmed or predetermined by the user.

Figure 6:
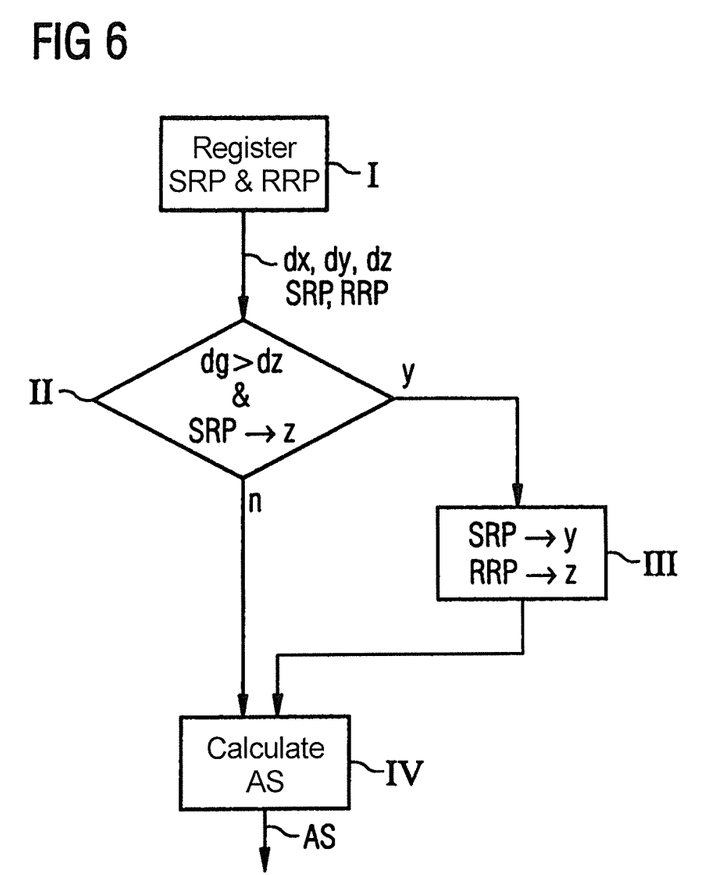
FIG. 6 is a flowchart of an exemplary embodiment of the method according to the invention for the determination of a control sequence.

This is explained using FIG. 6. In a first method step I, the slice selection direction parameter SRP (i.e. here a slab selection direction parameter) and a refocusing direction parameter RRP are typically registered (for example are adopted from the protocol) and moreover the viewing volume dimension parameter values dx, dy, dz are registered. In the exemplary embodiment according to FIG. 1, this takes placed as was already mentioned with the aid of the interfaces 23 and 24.

These data are then passed to a direction definition unit 26. This direction definition unit 26 has a direction parameter testing unit 27 that checks whether the first selection direction $SR_1$ and the second selection direction $SR_2$ correspond to the predetermined conditions with regard to the viewing volume dimensions. Specifically, a check is made as to whether the width or the viewing volume dimension parameter value dy is greater in the classical phase encoding direction (here, the y-direction) than the width or the viewing volume dimension parameter value dz in the classical slab selection direction (i.e. the z-direction). Moreover, a check is made as to whether the slice selection direction parameter SRP is selected so that it likewise lies in the z-direction. If this classical combination is provided—meaning that the dimensions of the viewing volume $V_{in}$ are selected by the user and the first selection direction $SR_1$ and the second selection direction $SR_2$ are defined by the protocol so that the refocusing radio-frequency pulse $RF_R$ must act selectively in the direction of a longer extent of the viewing volume $V_{in}$ as the slab excitation radio-frequency pulse $RF_S$ (branch "y")—in Step III it is ensured that the slice selection direction parameter SRP and the refocusing direction parameter RRP are changed so that now the slice selection travels in the y-direction and the refocusing direction travels in the z-direction. It is automatically ensured that the slab selection radio-frequency pulse $RF_S$ must then act selectively in the y-direction (i.e. in the classical phase encoding direction) and the refocusing radio-frequency pulse $RF_R$ must only still act selectively in the slice selection direction (i.e. in the z-direction). This swapping of the selection direction parameters SRP and the refocusing direction parameter RRP can, for example, be implemented in a direction parameter modification unit 28 of the direction definition unit 26 which receives the result from the direction parameter testing unit 27.

If, in the check in Step II, it turns out that one of the two conditions is not satisfied, it is to be assumed that (by chance) the operator has chosen the viewing volume $V_{in}$ so that the dimension in the z-direction is greater anyway than in the y-direction. In this case (branch "n"), no change or swapping of the selection direction parameter SRP and of the refocusing direction parameter RRP must take place.

With the selection direction parameter SRP and refocusing direction parameter RRP that are automatically optimized in such a manner, the control sequence AS can be calculated in Step IV with a conventional method.

The calculation of the control sequence thereby takes place in a pulse arrangement determination unit 29.

Figure 7:
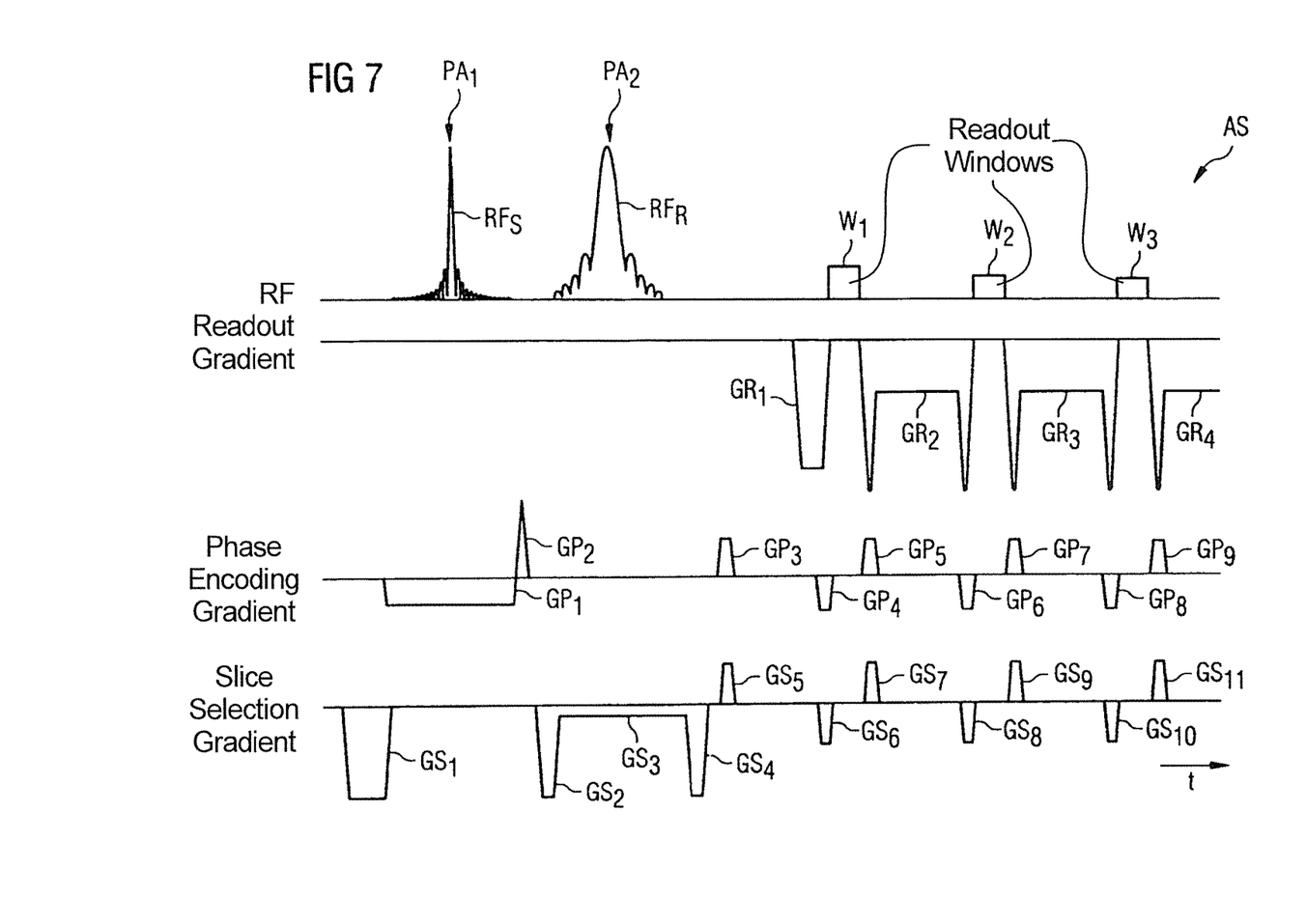
FIG. 7 is a sequence diagram for an example of an inner volume refocusing sequence given a selection of the selection direction that is optimized according to the invention.

FIG. 7 shows a corresponding pulse diagram with a control sequence AS analogous to the control sequence AS' in FIG. 5, wherein here however the first pulse arrangement $PA_1$ and the second pulse arrangement $PA_2$ have been optimized with the method according to the invention to the effect that the first selection direction $SR_1$ and the second selection direction $SR_2$ have been selected under consideration of the dimensions of the viewing volume $V_{in}$ chosen by the user. This has led to the situation that now a gradient is no longer emitted in the slice selection direction (i.e. the z-direction), parallel to the slab excitation radio-frequency pulse $RF_S$, but rather instead of this a gradient pulse $GP_1$ is emitted in the classical phase encoding direction (i.e. in the y-direction). Here the slab excitation radio-frequency pulse $RF_S$—which must only achieve a significantly smaller target flip angle—must thus act selectively in the longer extent direction of the viewing volume $V_{in}$ (see FIG. 4, the extent in the y-direction in relation to the extent of the viewing volume $V_{in}$ in the z-direction in FIG. 3). However, this is unproblematical since the slab excitation radio-frequency pulse $RF_S$ must only achieve a target flip angle of 90°. In contrast to this, the second pulse arrangement $PA_2$ of the control sequence AS is selected so that now a gradient pulse $GS_3$ in the slice selection direction (i.e. in the z-direction) is emitted in parallel with the refocusing radio-frequency pulse $RF_R$. The refocusing radio-frequency pulse $RF_R$ only needs to still act selectively over the smaller extent dz. This leads to the situation that the corresponding gradient pulse $GS_3$ can be chosen to be greater in the slice selection direction z than given the conventional gradient pulse $GP_2'$ (see FIG. 5) to be switched in the phase encoding direction. Overall, it is thus ensured that the control device AS is insensitive to $B_0$ inhomogeneities, and in particular to the chemical shift, such that aliasing artifacts can be avoided with a greater probability.

In FIG. 7, the gradient pulses $GR_1$, $GR_2$, $GR_3$, $GR_4$ in the readout direction again have the same function as was described above regarding FIG. 5. The gradient pulses $GP_2'$, $GP_3'$ in the phase encoding direction and the gradient pulses $GS_1'$, $GS_3'$, $GS_4'$ likewise again serve as spoilers or, respectively, rephasers, analogous to the explanations above. The additional gradient pulses $GP_4'$, . . . , $GP_{10}'$ in the phase encoding direction, as well as the additional gradient pulses in the slice selection direction $GS_5'$, . . . , $GS_{11}'$, are again normal phase encoding gradients.

At this point it is noted that an optimization can also take place under consideration of the third direction (i.e. the readout direction). For this, only the method steps II and III must be modified accordingly, wherein care is then advantageously taken that the readout direction is always placed so that it corresponds to the longest dimension of the viewing volume selected by the user, since it costs nearly no time to accordingly increase the sampling in the readout direction.

A particular advantage of this method is that the previous methods must merely be supplemented by the method steps II and III depicted in FIG. 6, and otherwise no additional changes need to be made in the method or in the existing protocols. Furthermore, the method also has the advantage that no additional hardware is required. In principle, it can be applied at all previously known MR systems, thus both at systems with only one transmission channel and at pTX systems.

In conclusion, it is noted that the methods and designs described in detail in the preceding are exemplary embodiments, and that the basic principle can also be varied by those skilled in the art without departing the scope of the invention. For example, the control sequence determination device 22 can also be realized as part of the control device 10 itself instead of at the terminal, in particular also as a component of the measurement control unit 15. The control sequence determination device could likewise also be realized at a separate computer system which, for example, is connected with the magnetic resonance system 1 via the network NW.

Although modifications and changes may be suggested by those skilled in the art, it is the intention of the inventor to

I claim as my invention:

1. A computerized method to determine a magnetic resonance control sequence comprising at least one first pulse arrangement that spatially selectively excites nuclear spins in an examination subject in a first selection direction, and a subsequent second pulse arrangement that spatially selectively excites said nuclear spins in said examination subject in a second selection direction, said method comprising:
   providing a computerized processor with viewing volume dimension parameter values that define a spatial extent of a viewing volume within the examination subject in which said nuclear spins are to be excited;
   in said computerized processor, establishing said first selection direction and said second selection direction in said magnetic resonance control sequence automatically depending on a length ratio of a spatial extent of said viewing volume in the respective first selection direction and the second selection direction; and
   via an output interface of said computerized processor, making the magnetic resonance control sequence, with the established first and second selection directions, available in an electronic format configured to operate a magnetic resonance apparatus to acquire magnetic resonance data according to said magnetic resonance control sequence.

2. A method as claimed in claim 1 comprising, in said processor, generating said first pulse arrangement in said magnetic resonance control sequence as a slab excitation radio-frequency pulse, and generating said second pulse arrangement as a refocusing radio-frequency pulse, with a target flip angle of said slab selection radio-frequency pulse being smaller than a target flip angle of said refocusing radio-frequency pulse.

3. A method as claimed in claim 1 wherein the step of providing said computerized processor with said viewing volume dimension parameter values comprises providing said computerized processor with a first selection direction parameter that defines said first selection direction and a second selection direction parameter that defines said second selection direction, and, in said computerized processor, automatically modifying said first selection direction parameter and said selection direction parameter if said first selection direction defined by said first selection direction parameter and said second selection direction defined by said second selection direction parameter do not satisfy a predetermined condition that is dependent on said length ratio.

4. A method as claimed in claim 3 wherein said viewing volume comprises respectively different spatial extents along different spatial directions of said viewing volume, and wherein said predetermined condition is that said second selection direction coincide with a spatial direction of said viewing volume that has a smallest extent.

5. A method as claimed in claim 4 comprising, in said processor, automatically exchanging the first slice direction defined by said first selection direction parameter and the second selection direction defined by said second selection direction parameter if the second selection direction defined by said second selection direction parameter does not coincide with said spatial direction of said viewing volume having said smallest extent.

6. A method to operate a magnetic resonance apparatus comprising:
   providing a computerized processor with viewing volume dimension parameter values that define a spatial extent of a viewing volume within the examination subject in which said nuclear spins are to be excited;
   in said computerized processor, establishing said first selection direction and said second selection direction in said magnetic resonance control sequence automatically depending on a length ratio of a spatial extent of said viewing volume in the respective first selection direction and the second selection direction; and
   via an output interface of said computerized processor, transferring the magnetic resonance control sequence, with the established first and second selection directions, to a magnetic resonance apparatus, and operating the magnetic resonance apparatus to acquire magnetic resonance data according to said magnetic resonance control sequence.

7. A computerized control sequence determination device to determine a magnetic resonance control sequence comprising at least one first pulse arrangement that spatially selectively excites nuclear spins in an examination subject in a first selection direction, and a subsequent second pulse arrangement that spatially selectively excites said nuclear spins in said examination subject in a second selection direction, said device comprising:
   an input interface configured to provide said computerized processor with viewing volume dimension parameter values that define a spatial extent of a viewing volume within the examination subject in which said nuclear spins are to be excited;
   said computerized processor being configured to establish said first selection direction and said second selection direction in said magnetic resonance control sequence automatically depending on a length ratio of a spatial extent of said viewing volume in the respective first selection direction and the second selection direction; and
   an output interface of said computerized processor configured to make the magnetic resonance control sequence, with the established first and second selection directions, available in an electronic format configured to operate a magnetic resonance apparatus to acquire magnetic resonance data according to said magnetic resonance control sequence.

8. A computerized control sequence determination device as claimed in claim 7:
   wherein said input interface is configured to provide said computerized processor with a first selection direction parameter that defines said first selection direction and a second selection direction parameter that defines said second selection direction; and
   said computerized processor comprises a direction parameter modification unit configured to automatically modify said first selection direction parameter and said selection direction parameter if said first selection direction defined by said first selection direction parameter and said second selection direction defined by said second selection direction parameter do not satisfy a predetermined condition that is dependent on said length ratio.

9. A magnetic resonance apparatus comprising:
   a magnetic resonance data acquisition unit comprising a radio-frequency transmitter, a gradient system, and a control unit;
   a computerized processor provided with viewing volume dimension parameter values that define a spatial extent of a viewing volume within the examination subject in which said nuclear spins are to be excited;

said computerized processor being configured to establish said first selection direction and said second selection direction in said magnetic resonance control sequence automatically depending on a length ratio of a spatial extent of said viewing volume in the respective first selection direction and the second selection direction;

said computerized processor comprising an output interface in communication with said control unit, and being configured to transfer the magnetic resonance control sequence, with the established first and second selection directions, in an electronic format to said control unit; and said control unit being configured to operate the radio-frequency transmitter and the gradient system of the magnetic resonance data acquisition unit to acquire magnetic resonance data according to said magnetic resonance control sequence.

10. A non-transitory, computer-readable data storage medium encoded with programming instructions, said storage medium being loaded into a computerized processor, and said programming instructions causing said processor to:

generate a magnetic resonance control sequence comprising at least one first pulse arrangement that spatially selectively excites nuclear spins in a first slice selection direction of an examination subject, and a subsequent second pulse arrangement that spatially selectively excites said nuclear spins in said examination subject in a second selection direction;

receive volume dimension parameter values that define a spatial extent of a viewing volume within the examination subject in which said nuclear spins are to be excited;

establish said first selection direction and said second selection direction in said magnetic resonance control sequence automatically depending on a length ratio of a spatial extent of said viewing volume in the respective first selection direction and the second selection direction; and via an output interface of said computerized processor, make the magnetic resonance control sequence, with the established first and second selection directions, available in an electronic format configured to operate a magnetic resonance apparatus to acquire magnetic resonance data according to said magnetic resonance control sequence.

* * * * *